US007682527B2

(12) United States Patent
Barron et al.

(10) Patent No.: US 7,682,527 B2
(45) Date of Patent: Mar. 23, 2010

(54) FABRICATION OF LIGHT EMITTING FILM COATED FULLERENES AND THEIR APPLICATION FOR IN-VIVO LIGHT EMISSION

(75) Inventors: Andrew R. Barron, Houston, TX (US); Dennis J. Flood, Oberlin, OH (US); John Ryan Loscutova, Houston, TX (US)

(73) Assignee: William Marsh Rice University, Houston, TX (US)

( * ) Notice: Subject to any disclaimer, the term of this patent is extended or adjusted under 35 U.S.C. 154(b) by 0 days.

(21) Appl. No.: 11/834,471

(22) Filed: Aug. 6, 2007

(65) Prior Publication Data
US 2008/0171204 A1 Jul. 17, 2008

Related U.S. Application Data

(63) Continuation of application No. 10/534,452, filed as application No. PCT/US03/37188 on Nov. 19, 2003, now Pat. No. 7,253,014.

(60) Provisional application No. 60/427,533, filed on Nov. 19, 2002.

(51) Int. Cl.
*H01B 1/00* (2006.01)
*H01B 1/04* (2006.01)
(52) U.S. Cl. ........................ 252/506; 252/500; 252/502; 252/510; 252/507; 252/509; 977/700; 977/734; 977/737; 977/742
(58) Field of Classification Search ................. 252/500, 252/502, 506, 507, 509, 510; 977/700, 734, 977/737, 742
See application file for complete search history.

(56) References Cited

U.S. PATENT DOCUMENTS

| 5,162,279 | A | 11/1992 | Miki |
| 5,274,018 | A | 12/1993 | Tanaka et al. |
| 5,308,661 | A | 5/1994 | Feng et al. |
| 5,397,350 | A | 3/1995 | Chow et al. |
| 5,416,188 | A | * 5/1995 | Chiang et al. ............ 528/291 |
| 5,420,081 | A | 5/1995 | Mattes et al. |
| 5,424,054 | A | 6/1995 | Bethune et al. |
| 5,454,880 | A | 10/1995 | Sariciftci et al. |
| 5,648,128 | A | 7/1997 | Yeh et al. |
| 5,690,807 | A | 11/1997 | Clark, Jr. et al. |
| 5,744,399 | A | 4/1998 | Rostoker et al. |
| 5,747,161 | A | 5/1998 | Iijima |
| 5,908,585 | A | 6/1999 | Shibuta |
| 5,914,151 | A | 6/1999 | Usuki |
| 6,080,683 | A | 6/2000 | Faur et al. |
| 6,126,740 | A | 10/2000 | Schulz et al. |
| 6,203,814 | B1 | 3/2001 | Fisher et al. |
| 6,207,229 | B1 | 3/2001 | Bawendi et al. |
| 6,277,766 | B1 | 8/2001 | Ayers |
| 6,333,598 | B1 | 12/2001 | Hsu et al. |
| 6,346,136 | B1 | 2/2002 | Chen et al. |
| 6,348,295 | B1 | 2/2002 | Griffith et al. |
| 6,486,489 | B2 | 11/2002 | Watanabe et al. |
| 6,548,168 | B1 | * 4/2003 | Mulvaney et al. ............ 428/402 |
| 6,559,375 | B1 | 5/2003 | Meissner et al. |
| 6,645,455 | B2 | 11/2003 | Margrave et al. |
| 6,657,696 | B2 | 12/2003 | Aruga |
| 6,683,783 | B1 | 1/2004 | Smalley et al. |
| 6,685,986 | B2 | 2/2004 | Oldenburg et al. |
| 6,710,366 | B1 | 3/2004 | Lee et al. |
| 6,723,624 | B2 | 4/2004 | Wang et al. |
| 6,740,910 | B2 | 5/2004 | Roesner et al. |
| 6,755,530 | B1 | 6/2004 | Loftus et al. |
| 6,770,497 | B2 | 8/2004 | Ihm |
| 6,827,918 | B2 | 12/2004 | Margrave et al. |
| 6,835,366 | B1 | 12/2004 | Margrave et al. |
| 6,841,139 | B2 | 1/2005 | Margrave et al. |
| 6,852,920 | B2 | 2/2005 | Sager et al. |
| 6,863,942 | B2 | 3/2005 | Ren et al. |
| 6,875,412 | B2 | 4/2005 | Margrave et al. |
| 6,882,094 | B2 | 4/2005 | Dimitrijevic et al. |
| 6,894,359 | B2 | 5/2005 | Bradley et al. |

(Continued)

FOREIGN PATENT DOCUMENTS

| DE | 10036897 C3 | 1/2002 |
| EP | 1246205 A1 | 10/2002 |
| GB | 2370408 A | 6/2002 |
| JP | 08325195 | 12/1996 |
| KR | 100649743 B1 | 11/2006 |
| WO | 9921934 A1 | 5/1999 |
| WO | 0051186 A1 | 8/2000 |
| WO | 0161753 A1 | 8/2001 |

(Continued)

OTHER PUBLICATIONS

Haremza et al. "Attachment of Single CdSe Nanocrystals to Individual Single-Walled Carbon Nanotubes." Nano Letters, 2, pp. 1253-1258, available online Oct. 22, 2008.*

(Continued)

*Primary Examiner*—Mark Kopec
*Assistant Examiner*—Tri V Nguyen
(74) *Attorney, Agent, or Firm*—Conley Rose, P.C.; Rodney B. Carroll

(57) ABSTRACT

A nanoparticle coated with a semiconducting material and a method for making the same. In one embodiment, the method comprises making a semiconductor coated nanoparticle comprising a layer of at least one semiconducting material covering at least a portion of at least one surface of a nanoparticle, comprising: (A) dispersing the nanoparticle under suitable conditions to provide a dispersed nanoparticle; and (B) depositing at least one semiconducting material under suitable conditions onto at least one surface of the dispersed nanoparticle to produce the semiconductor coated nanoparticle. In other embodiments, the nanoparticle comprises a fullerene. Further embodiments include the semiconducting material comprising CdS or CdSe.

19 Claims, No Drawings

U.S. PATENT DOCUMENTS

| | | | |
|---|---|---|---|
| 6,918,946 | B2 | 7/2005 | Korgel et al. |
| 6,946,597 | B2 | 9/2005 | Sager et al. |
| 6,969,897 | B2 | 11/2005 | Kim, II |
| 6,970,239 | B2 | 11/2005 | Chan et al. |
| 6,992,322 | B2 | 1/2006 | Narayan |
| 7,087,832 | B2 | 8/2006 | Scher et al. |
| 7,129,554 | B2 | 10/2006 | Lieber et al. |
| 7,253,014 | B2 | 8/2007 | Barron et al. |
| 7,253,431 | B2 | 8/2007 | Afzali-Ardakani et al. |
| 7,321,097 | B2 | 1/2008 | Engelhardt et al. |
| 2002/0094699 | A1 | 7/2002 | Houng et al. |
| 2002/0110513 | A1 | 8/2002 | Margrave et al. |
| 2003/0065206 | A1 | 4/2003 | Bolskar et al. |
| 2003/0134433 | A1 | 7/2003 | Gabriel et al. |
| 2003/0234978 | A1 | 12/2003 | Garito et al. |
| 2004/0023317 | A1 | 2/2004 | Motamedi et al. |
| 2004/0062971 | A1* | 4/2004 | Nuber ............... 429/33 |
| 2004/0108298 | A1 | 6/2004 | Gao |
| 2004/0265209 | A1 | 12/2004 | Colbert et al. |
| 2005/0089684 | A1 | 4/2005 | Barron et al. |
| 2005/0119364 | A1 | 6/2005 | Grah et al. |
| 2006/0036045 | A1 | 2/2006 | Wilson et al. |
| 2006/0067870 | A1 | 3/2006 | Park et al. |
| 2006/0145194 | A1 | 7/2006 | Barron et al. |
| 2006/0186502 | A1 | 8/2006 | Shimotani et al. |
| 2006/0249203 | A1 | 11/2006 | Li et al. |
| 2007/0005116 | A1 | 1/2007 | Lo |
| 2008/0233040 | A1 | 9/2008 | Barron et al. |

FOREIGN PATENT DOCUMENTS

| | | | |
|---|---|---|---|
| WO | WO02/051782 | * | 7/2002 |
| WO | 02088024 A1 | | 11/2002 |
| WO | WO02/088024 | * | 11/2002 |
| WO | 03043934 A1 | | 5/2003 |
| WO | 2004042432 A2 | | 5/2004 |
| WO | 2004042432 A3 | | 5/2004 |
| WO | 2004044948 A2 | | 5/2004 |
| WO | 2004044948 A3 | | 5/2004 |
| WO | 2004046023 A2 | | 6/2004 |
| WO | 2004046023 A3 | | 6/2004 |
| WO | 2005000735 A2 | | 1/2005 |
| WO | 2005000735 A3 | | 1/2005 |
| WO | 2007041293 A2 | | 4/2007 |
| WO | 2007041293 A3 | | 4/2007 |
| WO | 2007084540 A2 | | 7/2007 |
| WO | 2007084540 A3 | | 7/2007 |

OTHER PUBLICATIONS

Banerjee et al. "Synthesis and Characterization of Carbon Nanotube-nanocrystal heterostructures." Nano Letters, 2, pp. 195-200, available online Jan. 12, 2002.*

Fu et al. "Selective coating of single wall carbon nanotubes with thin SiO2 Layer." Nanoletters. vol. 2, pp. 329-332. Mar. 2002.*

Balavoine, Fabrice, et al., "Helical crystallization of proteins on carbon nanotubes: a first step towards the development of new biosensors," Angew. Chem. Int. Ed, 1999, pp. 1912-1915, vol. 38, No. 13/14, Wiley-VCH Verlag GmbH.

Bronikowski, Michael J., et al., "Gas-phase production of carbon single-walled nanotubes from carbon monoxide via the HiPco process: a parametric study," Journal of Vacuum Science Technology, Jul./Aug. 2001, pp. 1800-1805, vol. 19, No. 4, American Vacuum Society.

Chen, Robert J., et al., "Noncovalent sidewall functionalization of single-walled carbon nanotubes for protein immobilization," Journal of the American Chemical Society, 2001, pp. 3838-3839, vol. 123, No. 16, American Chemical Society.

Collins, Philip G., et al., "Extreme oxygen sensitivity of electronic properties of carbon nanotubes," Science, Mar. 10, 2000, pp. 1801-1804, vol. 287, www.sciencemag.org.

Da Ros, Tatiana, et al., "Fullerene derivatives as potential DNA photoprobes," Australian Journal of Chemistry, 2001, pp. 223-224 plus cover, vol. 54, CSIRO Publishing, Australia.

Foreign communication from a related counterpart application, International Search Report, PCT/US02/37211, Mar. 10, 2003, 3 pgs.

Foreign communication from a related counterpart application, International Search Report, PCT/US03/37186, Mar. 1, 2005, 2 pgs.

Fu, Qiang, et al., "Selective coating of single wall carbon nanotubes with thin SiO2 layer," Nano Letters, 2002, pp. 329-332, vol. 2, No. 4, American Chemical Society.

Girifalco, L. A., et al., "Carbon nanotubes, buckyballs, ropes, and a universal graphitic potential," Physical Review B, Nov. 15, 2000, pp. 104-110, vol. 62, No. 19, The American Physical Society.

Kong, Jing, et al., "Functionalized carbon nanotubes for molecular hydrogen sensors," Advanced Materials, Sep. 14, 2001, pp. 1384-1386, vol. 13, No. 18, Wiley-VCH, Verlag GmbH.

Kong, Jing, et al., "Nanotube molecular wires as chemical sensors," Science, Jan. 28, 2000, pp. 622-625, vol. 287, www.sciencemag.org.

Kuzumaki, Toru, et al., "Mechanical characteristics and preparation of carbon nanotube fiber-reinforced Ti composite," Advanced Engineering Materials, 2000, pp. 416-418, vol. 2, No. 7.

O'Connell, Michael J., et al., "Band-gap fluorescence from individual single-walled carbon nanotubes," Science, Jul. 26, 2002, pp. 593-596, vol. 297, www.sciencemag.org.

O'Connell, Michael J., et al., "Reversible water-solubilization of single-walled carbon nanotubes by polymer wrapping," Chemical Physics Letters, 2001, pp. 265-271, Elsevier.

Seeger, T., et al., "Nanotube composites: novel SiO2 coated carbon nanotubes," Chem. Commun., 2002, pp. 1-5, Royal Society of Chemistry, Great Britain.

Seeger, T. et al., "SiOx-coating of carbon nanotubes at room temperature," Chemical Physics Letters, 2001, pp. 41-46, vol. 339, Elsevier.

Thess, Andreas, et al., "Crystalline ropes of metallic carbon nanotubes," Science, Jul. 26, 1996, pp. 483-487, vol. 273, Issue 5274, American Association for the Advancement of Science. U.S.

Tsang, Shik Chi, et al., "Immobilization of platinated and iodinated oligonucleotides on carbon nanotubes," Angew. Chem. Int., Ed. Engl., 1997, pp. 2198-2200, vol. 36, No. 20, Wiley-VCH, Verlag GmbH.

Foreign communication from a related counterpart application, International Preliminary Examination Report, PCT/ US02/37211, Dec. 4, 2003, 31 pgs.

Foreign communication from a related counterpart application, Written Opinion, PCT/US02/37211, Sep. 30, 2003, 5 pgs.

Foreign communication from a related counterpart application—International Search Report, PCT/US03/37188, Dec. 21, 2004, 3 pgs.

Foreign communication from a related counterpart application—International Preliminary Examination Report, PCT/US03/37188, Sep. 30, 2005, 4 pgs.

Foreign communication from a related counterpart application—International Search Report and Written Opinion, PCT/ US2008/063404, Sep. 12, 2008, 15 pages.

Foreign communication from a related counterpart application—International Search Report and Written Opinion, PCT/ US2008/063076, Sep. 16, 2008, 13 pages.

Office Action (Final) dated Nov. 4, 2008 (6 pages), U.S. Appl. No. 10/534,431, filed Jan. 24, 2006.

Office Action dated Jun. 13, 2008 (7 pages), U.S. Appl. No. 10/496,066, filed Nov. 17, 2004.

Office Action dated May 6, 2008, (7 pages), U.S. Appl. No. 10/534,431, filed Jan. 24, 2006.

Whitsitt, Elizabeth A., et al., "Silica coated single walled carbon nanotubes," Nano Letters, 2003, pp. 775-778, vol. 3, No. 6, American Chemical Society.

Foreign communication from a related counterpart application—Supplementary European Search Report of Application No. EP 02 78 9769, Jan. 7, 2009, 8 pages.

Foreign communication from a related counterpart application—Supplementary European Search Report of Application No. EP 03 78 6924, Mar. 26, 2009, 3 pages.

Foreign communication from a related counterpart application—Supplementary European Search Report of Application No. EP 03 81 6414, Mar. 27, 2009, 3 pages.

Hernadi, K., et al., "Synthesis of MWNT-based composite materials with inorganic coating," Acta Materialia, 2003, pp. 1447-1452, vol. 51, Acta Materialia Inc., published by Elsevier Science Ltd.

Kreupl, Franz, et al., "A status report on technology for carbon nanotube devices," Solid State Technology, Apr. 1, 2002, pp. S9, S10, S12, S14, S16, vol. 45, Issue 4, Penwell Corporation, Tulsa, OK.

Office Action (Final) dated Jan. 23, 2009 (19 pages), U.S. Appl. No. 10/496,066, filed Nov. 17, 2004.

Office Action dated Apr. 24, 2009 (10 pages), U.S. Appl. No. 10/534,431, filed Jan. 24, 2006.

Satishkumar, B. C., et al., "Oxide nanotubes prepared using carbon nanotubes as templates," Journal of Materials Research, Mar. 1997, pp. 604-606, vol. 12, No. 3, Materials Research Society.

O'Connell, Michael J., Editor, "Carbon nanotubes properties and applications," 2006, pp. 90-104 plus 2 cover pages, 1 publishing page, and 1 conclusion page, CRC Press, Taylor & Francis Group.

Office Action dated Aug. 5, 2009 (13 pages), U.S. Appl. No. 10/496,066, filed Nov. 17, 2004.

\* cited by examiner

FABRICATION OF LIGHT EMITTING FILM COATED FULLERENES AND THEIR APPLICATION FOR IN-VIVO LIGHT EMISSION

CROSS-REFERENCE TO RELATED APPLICATIONS

This is a Continuation Application of U.S. patent application Ser. No. 10/534,452, filed Nov. 1, 2005, now U.S. Pat. No. 7,253,014,entitled "Fabrication of Light Emitting Film Coated Fullerenes and Their Application for In-Vivo Light Emission," which was a filing under 35 U.S.C. 371 of International Application No. PCT/US2003/037188 filed Nov. 19, 2003, claiming priority of the benefit of U.S. Provisional Application Ser. No. 60/427,533 filed Nov. 19, 2002, all of which applications having the same title are hereby incorporated by reference herein in their entirety.

STATEMENT REGARDING FEDERALLY SPONSORED RESEARCH OR DEVELOPMENT

Not applicable.

BACKGROUND OF THE INVENTION

1. Field of the Invention

This invention relates to the field of fullerenes and more specifically to the field of coating fullerenes with coatings capable of emitting and/or absorbing light.

2. Background of the Invention

Nanoparticles have been increasingly studied due to their physical and chemical properties. One such property is the ability of some nanoparticles to emit light. For instance, CdS nanoparticles have been used on photoconducting materials to increase photoconductivity and also to produce light emitters. Typically, photoluminescence of quantum dots of nanoparticles is accomplished by irradiating the quantum dot with light of a frequency that results in emission of light at a different, lower frequency. The nanoparticle quantum dots are typically incorporated into structures such as diodes to enhance the photoluminescence of the structures. Such structures are typically much larger than nanoparticle size. The nanoparticles are usually coated on the structures by a sol-gel type reaction.

A drawback to photoluminescence of semiconductor dots is that the emitted light is typically not polarized. For instance, the aspect ratio of light emitted from the quantum dot is typically too low for polarization. Further drawbacks include the size of the coated structures. For instance, the size of the coated structures may be too large for applications on the nano-scale such as the in-vivo environment. Other drawbacks include the long reaction times typically involved with the sol-gel type reactions Consequently, there is a need for a more efficient process for coating light emitting and/or absorbing semiconductor materials on structures. Other needs include an improved process for illuminating the semiconductor materials. Additional needs include a process for coating light emitting and/or absorbing semiconductor materials on structures that can be used for applications on the nano-scale.

BRIEF SUMMARY OF SOME OF THE PREFERRED EMBODIMENTS

These and other needs in the art are addressed in one embodiment by a method of making a semiconductor coated nanoparticle comprising a layer of at least one semiconducting material covering at least a portion of at least one surface of a nanoparticle, comprising dispersing the nanoparticle under suitable conditions to provide a dispersed nanoparticle; and depositing at least one semiconducting material under suitable conditions onto at least one surface of the dispersed nanoparticle to produce the semiconductor coated nanoparticle.

In another embodiment, the present invention includes a semiconductor coated nanoparticle comprising a nanoparticle; and a semiconductor coating, wherein the semiconductor coating coats at least a portion of the nanoparticle.

In other embodiments, the nanoparticle comprises a fullerene. Additional embodiments include the semiconductor material comprising CdS or CdSe.

It will therefore be seen that a technical advantage of the present invention includes an improved method for coating nanoparticles capable of emitting light on structures that overcomes the problem of size of the structures as well as allowing non-spherical shapes to be coated by the use of non-spherical nanoparticle substrates. Further advantages include faster reaction times than the typical sol-gel process.

The foregoing has outlined rather broadly the features and technical advantages of the present invention in order that the detailed description of the invention that follows may be better understood. Additional features and advantages of the invention will be described hereinafter that form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

DETAILED DESCRIPTION OF THE PREFERRED EMBODIMENTS

It has been discovered that semiconducting material capable of emitting and/or absorbing light can be coated on nanoparticle substrates. The present invention provides a method of making a semiconductor coated nanoparticle comprising a layer of at least one semiconducting material covering at least a portion of at least one surface of a nanoparticle, comprising dispersing the nanoparticle under suitable conditions to provide a dispersed nanoparticle; and depositing at least one semiconducting material under suitable conditions onto at least one surface of the dispersed nanoparticle to produce the semiconductor coated nanoparticle. The present invention also provides for a nanoparticle substrate coated with a semiconducting material, with the semiconducting material preferably capable of emitting light. At least a portion of the surface of the nanoparticle substrate can be coated with the semiconducting material, preferably all of the surface.

Preferably, the nanoparticle substrate comprises fullerenes. Fullerenes comprise any carbonaceous material having a structure of a regular, three-dimensional network of fused carbon rings. Such a network of fused carbon rings can be arranged in any suitable structure. Without limiting the invention, examples of such structures include cylindrical, spherical, ovoid, oblate and oblong structures. Typical fullerenes include cylindrical carbon nanotubes and icosahedral $C_{60}$ carbon molecules. Preferably, the fullerenes comprise at least one of $C_{60}$ molecules, $C_{72}$ molecules, $C_{84}$ molecules, $C_{96}$ molecules, $C_{108}$ molecules, $C_{120}$ molecules, ovoid molecules, single-walled carbon nanotubes (SWNTs), and multi-walled carbon nanotubes (MWNTs). More preferably, the fullerenes can be selected from $C_{60}$ molecules, ovoid molecules, and SWNTs. SWNTs comprise one tube about a given center, and MWNTs comprise more than one nested tube about a common center. In alternative embodiments, the fullerene comprises any surface modified fullerene.

Semiconducting materials are well known in the art, and the present invention includes any such semiconducting materials suitable for coating on a nanoparticle substrate. Preferably, the semiconducting materials are capable of emitting and/or absorbing light, more preferably capable of absorbing and emitting light. Without limiting the present invention, examples of suitable semiconducting materials include photonic bandgap engineered materials; III-V and II-VI binary, ternary, and quaternary compound semiconductors; metallic oxides; polymers; liquid crystals; and suitable organic compounds. Preferably, the semiconducting materials comprise at least one of ZnS, CdS, CdSe, GaAs, InP, GaS, TiO2, and $Fe_2S_3$. More preferably, semiconducting materials comprise at least one of CdS and CdSe. The coated nanoparticle substrate of the present invention comprises any suitable nanoparticle substrate coated with a desired amount of any suitable semiconducting material, preferably capable of emitting and/or absorbing light. A preferable embodiment of the present invention comprises a fullerene coated with CdS or CdSe. A more preferable embodiment of the present invention comprises a SWNT coated with CdS or CdSe.

Without being limited by theory, it has not been demonstrated, but it is believed that providing a hollow quantum dot comprising a semiconducting material, preferably capable of emitting and/or absorbing light, such as CdS, coated on a nanoparticle substrate, such as a SWNT, can result in the emission of light and also can result in an aspect ratio suitable to produce a polarized light emission.

Method of Coating the Nanoparticle Substrate

Dispersing the nanoparticle under suitable conditions to provide a dispersed nanoparticle is accomplished by dispersing the nanoparticle in a liquid. The nanoparticle can be any suitable nanoparticle, preferably a fullerene. Preferably, dispersing the nanoparticle activates at least a portion of at least one surface of the nanoparticle. Without limiting the present invention to any theory, it is believed that dispersing a fullerene activates the surface of the fullerene for deposition of a semiconducting material, preferably one capable of emitting and/or absorbing light. The fullerene is preferably dispersed by chemical functionalization.

Chemical functionalization of a fullerene is well known in the art, and the present invention can include any chemical functionalization technique suitable for dispersing a fullerene and activating its surface. Without being limited by theory, it is believed that chemical functionalization provides at least one specific reactive site for growth of the semiconducting material. Moreover, without limiting the invention, examples of suitable chemical functionalization techniques include hydroxylation. Hydroxylation comprises reacting the surface of the fullerene with a chemical reagent or reagents that result in the formation of a number of hydroxide groups chemically bound to the surface of the fullerene. The hydroxide group is a chemical species consisting of an oxygen and a hydrogen, i.e., OH.

In an alternative embodiment, the fullerene is dispersed by surfactant addition. Suitable surfactants include sodium dodecylsulfate (SDS), dodecyltrimethyl ammonium bromide (DTAB), N-hexadecyl-N(2-hydroxy-ethyl)-N,N'-dimethylammonium bromide, sodium dodecyl (benzenesulfonate), and dodecyl(benzene)trimethylammonium halide. Preferably, the surfactants comprise sodium dodecylsulfate and/or dodecyltrimethyl ammonium bromide. Surfactant addition comprises dispersing the fullerene in a water solution of the surfactant. This can be accomplished by the addition of heat or through sonic waves.

Depositing at least one semiconducting material under suitable conditions onto at least one surface of the dispersed nanoparticle, preferably a fullerene, is accomplished by catalyzing growth of the semiconducting material on the activated surface of the nanoparticle. Catalyzing such growth comprises contacting the dispersed fullerene with a solution comprising chemical precursors to the semiconducting material. Preferably, the nanoparticle substrate is at least partially dissolved in the solution. It is also preferable to use a non sol-gel approach to allow seeded growth on the surface of the fullerene and have a faster reaction time than a typical sol-gel approach. The solution comprises chemical precursors that react to generate the desired semiconducting material. For instance, when the semiconducting material comprises CdS, the CdS solution can be prepared by the following Equation (1), where TEA is triethanolamine.

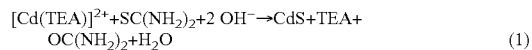

(1)

In another example, when the semiconducting material comprises CdSe, the CdSe solution can be prepared by the following Equation (2),

(2)

Preferably, capping agents are used to control the surface growth. Capping agents can include at least one of n-tetradecylphosphonic acid, ethanol, and organic thiols of the general formula RSH, where R is an organic group, which is preferably n-tetradecylphosphonic acid. Without being limited by theory, it is believed that the capping agents act as surfactants to the fullerene and also slow and control the growth of the semiconducting material by weakly binding to the surface of the growing material. Capping agents are preferably added to the solution in excess, preferably at least in a ratio of 4:1 with regard to the metal source, e.g., the Cd precursor compound in the synthesis of CdSe.

The semiconducting material is grown on the fullerene until the desired thickness of the coating is achieved. Preferably, the nanoparticle coating is between 0.1-50 µm thick, more preferably less than 10 µm thick. After the desired thickness is achieved, the coating reaction is quenched, and the coated fullerenes can be removed from the solution. The coated fullerenes can be removed by any suitable technique, preferably by centrifuge. Preferably, the coated fullerene is then purified by re-dispersing the fullerene in a suitable solvent such as ethanol.

To further illustrate various illustrative embodiments of the present invention, the following examples are provided.

EXAMPLES

Examples 1-13 (CdS Fullerenols)

Examples 1-13 demonstrate the coating of fullerenols by CdS.

Experiment 1

A $[Cd^{2+}]$ bath concentration was set at 50 mM. Only triethanolamine (TEA) ratios were varied to avoid colloidal (precipitation) regime of CdS deposition from the bath. Relative molar ratios of Cd:TEA:NH$_4$OH:thiourea were set at 1:3.75:14.4:1, respectively. A typical experiment involved adding 10 mL of a 50 mg/L solution of fullerenols [$C_{60}(OH)_n$] to a centrifuge tube. $NH_4OH$, TU, TEA, and cadmium acetate were added in the respective order to the fullerenol solution, which produces the aforementioned 1 ($Cd^{2+}$):3.75 (TEA): 14.4 ($NH_4OH$):1 (thiourea) relative molar ratios with [$Cd^{2+}$] set at 50 mM. Therefore, in this example, [$Cd^{2+}$]=50 mM, [TEA]=187.5 mM, [$NH_4OH$]=720 mM, and [thiourea]=50 mM. Reagents were reacted without stirring in 50 mL centrifuge tubes with a water bath held at 60° C. for 8 hours. It was allowed to cool to room temperature. All bath final volumes were 30 mL. Results include a colloid size of 1.5 µm and an orange deposit on the walls. In addition, a large amount of precipitate was produced and a clear liquid supernatent was observed.

Experiment 2

Bath conditions were identical to Experiment 1, except for changing the TEA relative ratio from 3.75 to 1.875 (93.75 mM). Results include a colloid size of 2-2.5 µm. In addition, other colloid sizes were polydispersed as low as 400 nm.

Experiment 3

Bath conditions were similar to Experiment 1. All bath reagent concentrations diluted 10-fold (5 mM $Cd^{2+}$; 1:3.75: 14.4:1 relative molar ratios of $Cd^{2+}$: TEA: $NH_4OH$: thiourea). 5 mL of 50 mg/L fullerenol seed was used. Baths were reacted without stirring at room temperature for 12 hours. The bath final volumes were 30 mL. The resulting CdS appeared amorphous.

Experiment 4

Bath conditions were identical to Experiment 3, except for the omission of 5 mL of added fullerenol seed. This was an unseeded (control) bath. The resulting CdS appeared amorphous.

Experiment 5

Bath conditions were identical to Experiment 4 (unseeded), but the [$Cd^{2+}$] equaled 12.5 mM. The 1:3.75:14.4:1 relative molar ratios of $Cd^{2+}$: TEA : $NH_4OH$ : TU were maintained. The resulting CdS appeared bulk and amorphous with no colloids.

Experiment 6

Bath conditions were identical to Experiment 5, but the [$Cd^{2+}$] equaled 25 mM. The resulting CdS appeared bulky and amorphous with no colloids.

Experiment 7

Bath conditions were identical to Experiment 5, but the [$Cd^{2+}$] equaled 37.5 mM. It appeared that the bulk texture changed to a colloidal nature.

Experiment 8

Bath conditions were identical to Experiment 5, but the [$Cd^{2+}$] equaled 50 mM. The experiment resulted in colloidal CdS colloids with more monodispersed colloids later seen.

Experiment 9

Bath conditions were identical to Experiment 8, but 10 mL of 50 mg/L fullerenol seed solution was added. Results included all colloids, with a colloid size of 1-1.6 µm. Also, larger 2-2.6 µm colloids were seen. The colloids were polydispersed.

Experiment 10

Bath conditions were identical to Experiment 8, but 5 mL of 50 mg/L fullerenol seed solution was added. Results included all polydispersed colloids. Also, larger 2.6 µm colloids were present with small 300-800 nm colloids.

Experiment 11

Bath conditions were identical to Experiment 10, but the $Cd^{2+}$ concentration was changed to 37.5 mM. Results included polydispersed colloids with sizes of 2.5-3 µm.

Experiment 12

Bath conditions were identical to Experiment 10, but the $Cd^{2+}$ concentration was changed to 25 mM. Results included very small monodispersed colloids with a size of 350-600 nm. Results also included the appearance of some non-colloidal deposits.

Experiment 13

Bath conditions were identical to Experiment 10, but the $Cd^{2+}$ concentration was changed to 12.5 mM. Results included no colloids and also an amorphous film-like CdS deposit.

Examples 14-23 (CdS SWNTs)

Examples 14-23 demonstrate the coating of SWNTs with CdS.

Experiment 14

1 mL of an aqueous 1% (w/w) sodium dodecylsulfate (SDS) solution of SWNTs (25 mg SWNTs/L) was added to a centrifuge tube, followed by the addition of $NH_4OH$ and TU. In a separate tube, a [$Cd^{2+}$(TEA)] solution was made by adding TEA to $Cd(OAc)_2$ and shaking to allow the TEA to complex with the $Cd^{2+}$ cations. This mixture was added dropwise to the SWNT/$NH_4OH$/TU solution to produce the aforementioned 1 ($Cd^{2+}$):3.75 (TEA):14.4 ($NH_4OH$):1 (TU) relative molar ratios, where [$Cd^{2+}$] was set at 5 mM. Therefore, in this example, [$Cd^{2+}$]=5 mM, [TEA]=18.75 mM, [$NH_4OH$]= 72 mM, and [TU]=5 mM. Reagents were reacted overnight at room temperature. The CdS coated SWNTs were washed six times by repeated centrifugation/redispersion in absolute EtOH. All bath final volumes were 1.6 mL.

Experiment 15

Bath conditions were identical to Experiment 14, but the [$Cd^{2+}$] equaled 0.5 mM. The 1:3.75:14.4:1 relative molar ratios of $Cd^{2+}$:TEA:$NH_4OH$:TU were maintained.

Experiment 16

Bath conditions were identical to Experiment 14, but the [$Cd^{2+}$] equaled 0.8 mM.

Experiment 17

Bath conditions were identical to Experiment 14, but the [$Cd^{2+}$] equaled 1 mM.

Experiment 18

Bath conditions were identical to Experiment 14, but the [$Cd^{2+}$] equaled 1.5 mM.

Experiment 19

Bath conditions were identical to Experiment 14, but the [$Cd^{2+}$] equaled 2.5 mM.

Experiment 20

Bath conditions were identical to Experiment 14, but the [$Cd^{2+}$] equaled 7.5 mM.

Experiment 21

Bath conditions were identical to Experiment 14, but the [$Cd^{2+}$] equaled 10 mM.

Experiment 22

Bath conditions were identical to Experiment 14, but the [$Cd^{2+}$] equaled 25 mM.

Experiment 23

Bath conditions were identical to Experiment 14, but the [$Cd^{2+}$] equaled 28 mM.

Examples 24-27 (CdSe SWNTs)

Examples 24-27 demonstrate the coating of SWNTs with CdSe.

Experiment 24

In a 50 mL centrifuge tube, 25 mg annealed HiPCO SWNTs was added. The tubes had been previously annealed under argon in a sealed tube furnace at 800° C., cooled, and gently ground. 30 mL of 1-octadecene (ODE) was added, and the tubes were vigorously sonicated for 20 seconds. After 30 seconds of settling, the tube was slightly swirled to suspend the SWNTs but not to disturb large settled chunks of undispersed SWNTs. The top 15 mL of the suspension was quickly transferred by pipet to a 50 mL Schlenk flask. 71.4 mg (256 μmol) tetradecylphosphonic acid (TDPA) and 8.2 mg (64 μmol) CdO was added to this suspension. This mixture was heated with stirring under argon to 300° C. to dissolve the CdO and then cooled to 250° C. At this point, 0.08 g of an $SePBu_3$ mixture (containing 2.53 mg (32 μmol) Se, 9.5 mg tetrabutylphosphine (TBP), 72.4 mg trioctylphosphine (TOP), and 15 mg toluene) was injected into the flask, and the reaction was allowed to proceed at 250° C. until completion (ca. 30 min), at which point the heating mantle was removed. The room temperature SWNT suspension was then extracted with an equal portion of $MeOH/CHCl_3$ (1:1) several times to remove excess Cd-TDPA complex. Absolute EtOH was added to the ODE/SWNT portion (~30 mL) to precipitate the tubes. Finally, the tubes were washed six times by repeated centrifugation/redispersion in EtOH.

Experiment 25

Experimental conditions were identical to those of Experiment 24, except that oleic acid (73 mg, 256 μmol) was substituted for TDPA as the complexing agent for cadmium.

Experiment 26

Experimental conditions were similar to those of Experiment 24, except that trioctylphosphine oxide (TOPO) was used as the solvent rather than ODE. The SWNTs were added to a hot (84° C.) melt of 5 g TOPO, and sonicated in a large test tube. After 10 seconds of settling, the top 80% of the suspension was quickly transferred by pipet to a 50 mL Schlenk flask and to this suspension was added 71.4 mg (256 μmol) tetradecylphosphonic acid (TDPA) and 8.2 mg (64 μmol) CdO. This mixture was heated with stirring under argon to 300° C. to dissolve the CdO and then cooled to 250° C. At this point, 0.08 g of an Se-TBP mixture (containing 2.53 mg (32 μmol) Se, 9.5 mg tetrabutylphosphine (TBP), 72.4 mg trioctylphosphine (TOP), and 15 mg toluene) was injected into the flask, and the reaction was allowed to proceed at 250° C. until completion (ca. 30 min), at which point the heating mantle was removed. When the melt had cooled to ca. 60° C., a large excess of toluene was added (~40 mL). This mixture was centrifuged, the supernatent discarded, and the tubes were washed 6 times by repeated centrifugation/redispersion in EtOH.

Experiment 27

Experimental conditions were identical to those of Experiment 26, except that oleic acid (73 mg, 256 μmol) was substituted for TDPA as the complexing agent for cadmium.

It will be understood that the present invention is not limited to the nanoparticle substrate comprising fullerenes. In alternative embodiments, the present invention comprises any inert nanoparticles. A preferable example of such an inert nanoparticle is an alumoxane. Additional examples include a fullerene coated with gold (or any other metal), an oxide, or a dielectric.

Even though it has not been demonstrated that the present invention produces light or polarized light from the nanoparticle substrate coated with the semiconducting materials, it is believed that such an invention could be functionalized for use with in vivo applications. Examples of such in vivo applications include disabling or destroying foreign bodies in the blood and lymph systems such as parasites, bacteria, viruses and pathogenic proteins; physical alteration or destruction of specific biomolecular structures such as cholesterol deposits on the interior of veins and arteries, as well as intracellular pathogens; cauterization of blood vessels without the need for invasive surgical techniques; photon-assisted wound healing; photon-assisted reconstruction of severed nerve tissue site specific molecular identification for diagnostic purposes; and the like. It is further believed but has not been demonstrated that the nanoparticle substrate coated with the semiconductor materials of the present invention can have the wavelength of emitted light selected for maximum effectiveness by the choice of nanoparticle and/or semiconductor materials and deposition parameters, and that it can be directly injected into targeted structures or can be fed intravenously.

Although the present invention and its advantages have been described in detail, it should be understood that various changes, substitutions and alterations may be made herein without departing from the spirit and scope of the invention as defined by the appended claims.

What is claimed is:

1. A composition, comprising,
   a fullerene;
   a functionalizing group disposed on at least a portion of a surface of the fullerene, wherein the functionalizing group comprises one or more hydroxide groups chemically bound to said surface portion of the fullerene; and
   a film of a semiconducting material disposed on at least the portion of the surface of the fullerene that includes the functionalizing group, wherein the semiconducting material disposed on at least said surface portion of the fullerene has a thickness in a range of about 100 nm to about 5000 nm and wherein the semiconductor material comprises at least one of ZnS, CdS, CdSe, GaAs, InP, GaS, $TiO_2$, and $Fe_2S_3$.

2. The composition of claim 1, wherein the functionalizing group provides at least one reactive site for growth of the semiconducting material.

3. The composition of claim 1, wherein the functionalizing group is suitable for dispersing the fullerene in a liquid.

4. The composition of claim 1, wherein the fullerene has at least one of a cylindrical, spherical, ovoid, oblate and oblong structure.

5. The composition of claim 1, wherein the film of the semiconducting material coats all of the surface of the fullerene.

6. The composition of claim 5, wherein the fullerene has at least one of a cylindrical, spherical, ovoid, oblate and oblong structure.

7. The composition of claim 1, wherein the fullerene comprises at least one of a $C_{60}$ molecule, $C_{72}$ molecule, $C_{84}$ molecule, $C_{96}$ molecule, $C_{108}$ molecule, $C_{120}$ molecule, single-walled carbon nanotube, and multi-walled carbon nanotube.

8. The composition of claim 1, wherein the semiconducting material is capable of at least one of absorbing and emitting light.

9. A composition, comprising:
a fullerene;
a functionalizing group disposed on at least a portion of a surface of the fullerene, wherein the functionalizing group comprises one or more hydroxide groups chemically bound to said surface portion of the fullerene; and
a semiconducting material coating at least the portion of the surface of the fullerene that includes the functionalizing group, wherein the semiconductor material comprises at least one of ZnS, CdS, CdSe, GaAs, InP, GaS, $TiO_2$, and $Fe_2S_3$ and wherein the semiconducting material coating on at least said surface portion of the fullerene has a thickness in a range of about 100 nm to about 5000 nm.

10. The composition of claim 9, wherein the fullerene has at least one of a cylindrical, spherical, ovoid, oblate and oblong structure.

11. The composition of claim 9, wherein the semiconducting material coats all of the surface of the fullerene.

12. The composition of claim 11, wherein the fullerene has at least one of a cylindrical, spherical, ovoid, oblate and oblong structure.

13. The composition of claim 9, wherein the functionalizing group provides at least one reactive site for growth of the semiconducting material.

14. The composition of claim 9, wherein the functionalizing group is suitable for dispersing the fullerene in a liquid.

15. The composition of claim 9, wherein the fullerene comprises at least one of a $C_{60}$ molecule, $C_{72}$ molecule, $C_{84}$ molecule, $C_{96}$ molecule, $C_{108}$ molecule, $C_{120}$ molecule, single-walled carbon nanotube, and multi-walled carbon nanotube.

16. The composition of claim 9, wherein the semiconducting material is capable of absorbing light.

17. The composition of claim 9, wherein the semiconducting material is capable of emitting light.

18. The composition of claim 1, wherein the film of the semiconducting material is of uniform heterogeneity.

19. A composition, comprising,
a fullerene;
a functionalizing group disposed on at least a portion of a surface of the fullerene, wherein the functionalizing group comprises one or more hydroxide groups chemically bound to said surface portion of the fullerene; and
a semiconducting material disposed on the portion of the surface of the fullerene that includes the functionalizing group, wherein the semiconductor material comprises at least one of ZnS, CdS, CdSe, GaAs, InP, GaS, $TiO_2$, and $Fe_2S_3$ and wherein the semiconducting material coats all of the surface of the fullerene and has a thickness in a range of about 100 nm to about 5000 nm.

* * * * *